United States Patent
Hong et al.

(10) Patent No.: US 11,781,210 B2
(45) Date of Patent: Oct. 10, 2023

(54) MAGNET ASSEMBLY AND DEPOSITION APPARATUS INCLUDING THE SAME

(71) Applicant: Samsung Display Co., LTD., Yongin-si (KR)

(72) Inventors: Jae Min Hong, Seongnam-si (KR); Jong Hyoek Ryu, Seoul (KR); Seung Min Jin, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/513,203

(22) Filed: Oct. 28, 2021

(65) Prior Publication Data

US 2022/0290288 A1    Sep. 15, 2022

(30) Foreign Application Priority Data

Mar. 9, 2021  (KR) .................. 10-2021-0030802

(51) Int. Cl.
  *C23C 14/04*   (2006.01)
  *C23C 14/56*   (2006.01)
  *H01L 27/32*   (2006.01)
  *B05C 21/00*   (2006.01)
  *H10K 59/00*   (2023.01)

(52) U.S. Cl.
  CPC .......... *C23C 14/042* (2013.01); *B05C 21/005* (2013.01); *C23C 14/56* (2013.01); *H10K 59/00* (2023.02)

(58) Field of Classification Search
  None
  See application file for complete search history.

(56) References Cited

U.S. PATENT DOCUMENTS

| | | | | |
|---|---|---|---|---|
| 5,753,092 | A * | 5/1998 | Hollars | C23C 14/56 204/298.25 |
| 6,749,690 | B2 * | 6/2004 | Clark | H01L 21/682 118/721 |
| 8,382,966 | B2 * | 2/2013 | Choi | H01J 37/3405 204/298.18 |
| 9,016,234 | B2 * | 4/2015 | Ko | C23C 14/12 118/721 |
| 9,045,818 | B2 * | 6/2015 | Gersdorff | H01L 21/68742 |
| 9,478,337 | B2 * | 10/2016 | Kim | H01F 7/0247 |
| 9,524,891 | B2 * | 12/2016 | You | B05B 12/20 |
| 9,583,245 | B2 * | 2/2017 | Hong | H01F 7/0252 |
| 9,666,346 | B2 * | 5/2017 | Noh | C23C 14/042 |
| 9,773,600 | B2 * | 9/2017 | Han | H01F 7/0221 |
| 9,959,961 | B2 * | 5/2018 | White | G03F 7/707 |

(Continued)

FOREIGN PATENT DOCUMENTS

| | | |
|---|---|---|
| JP | 4071861 B2 | 4/2008 |
| KR | 100814847 B1 | 3/2008 |

(Continued)

*Primary Examiner* — Jethro M. Pence
(74) *Attorney, Agent, or Firm* — CANTOR COLBURN LLP

(57) ABSTRACT

A magnet assembly includes a support plate and a plurality of magnets which are removably fixed to the support plate and applies a magnetic force to a deposition mask. Each magnet among the plurality of magnets include a first surface facing the support plate, a second surface opposite to the first surface and facing the deposition mask, and a magnet groove defined therein.

10 Claims, 8 Drawing Sheets

(56) References Cited

U.S. PATENT DOCUMENTS

| | | | |
|---|---|---|---|
| 10,053,766 B2* | 8/2018 | Kim | C23C 14/042 |
| 10,186,662 B2* | 1/2019 | Kim | H01L 51/56 |
| 10,233,539 B2* | 3/2019 | Ma | H01L 51/56 |
| 10,422,029 B2* | 9/2019 | Kishimoto | C23C 14/24 |
| 10,481,640 B2* | 11/2019 | Kim | H01L 51/0097 |
| 10,513,770 B2* | 12/2019 | Kishimoto | H05B 33/10 |
| 11,144,096 B2* | 10/2021 | Cho | G06F 1/1626 |
| 11,279,999 B2* | 3/2022 | Aoki | H01L 51/001 |
| 2006/0150910 A1* | 7/2006 | Han | C23C 14/042 |
| | | | 118/721 |
| 2006/0240669 A1* | 10/2006 | Kaneko | C23C 14/042 |
| | | | 438/680 |
| 2010/0055810 A1* | 3/2010 | Sung | H01L 51/0011 |
| | | | 438/22 |
| 2013/0126477 A1* | 5/2013 | Kelekar | H01L 21/67057 |
| | | | 427/256 |
| 2014/0199808 A1* | 7/2014 | Sugimoto | B23K 26/359 |
| | | | 156/60 |
| 2015/0013599 A1* | 1/2015 | You | H01L 21/673 |
| | | | 118/504 |
| 2015/0056370 A1* | 2/2015 | Lee | C23C 14/042 |
| | | | 118/721 |
| 2015/0083045 A1* | 3/2015 | You | C23C 14/042 |
| | | | 118/721 |
| 2016/0079532 A1* | 3/2016 | Yi | H01L 51/56 |
| | | | 438/758 |
| 2016/0104561 A1* | 4/2016 | Noh | C23C 14/042 |
| | | | 427/127 |
| 2019/0242003 A1* | 8/2019 | Lee | C23C 14/042 |
| 2021/0020874 A1* | 1/2021 | Hong | H01L 27/3223 |

FOREIGN PATENT DOCUMENTS

| | | |
|---|---|---|
| KR | 101108012 B1 | 1/2012 |
| KR | 1020160042316 A | 4/2016 |

* cited by examiner

MAGNET ASSEMBLY AND DEPOSITION APPARATUS INCLUDING THE SAME

This application claims priority to Korean Patent Application No. 10-2021-0030802 filed on Mar. 9, 2021, and all the benefits accruing therefrom under 35 U.S.C. § 119, the entire contents of which are incorporated herein by reference.

BACKGROUND

(a) Field

This disclosure relates to a magnet assembly and a deposition apparatus including the same.

(b) Description of the Related Art

A light emitting display device is used as a device for displaying an image. The light emitting display device may display an image by a combination of pixels, and each pixel may be realized by a light emitting diode.

The light emitting diode may include an anode, a cathode, and an emission layer therebetween. The emission layer of the light emitting diode may be provided or formed by a deposition method. For example, by arranging a substrate on which emission layers are to be formed, on a deposition mask on which a pattern is formed, and then passing a material of the emission layers through the pattern of the deposition mask, the emission layers matching the deposition mask pattern may be deposited on the substrate.

In order to closely contact the deposition mask and the substrate to each other, a magnet assembly in which magnets are arranged on a yoke plate may be used, and the substrate may be disposed between the deposition mask and the magnet assembly. The deposition mask and the substrate may closely contact each other with an adhesive force by magnetic force of the magnets.

SUMMARY

Embodiments provide a magnet assembly and a deposition apparatus including the same that may reduce peak adhesive force while maintaining an average adhesive force acting on a mask assembly by magnets of the magnet assembly.

A magnet assembly includes a yoke plate, and a plurality of magnets which are fixed to the yoke plate. Each magnet includes a first surface facing the yoke plate, a second surface facing in a direction opposite to the first surface, and a groove in the second surface.

The groove may extend along a length of the magnet at a depth from the second surface.

The groove may be extended along a length of the magnet at a central portion of the second surface.

The groove may not penetrate the magnet along a thickness direction of the magnet.

The groove may have a quadrangular, triangular, semicircular, or semi-elliptical cross-sectional shape.

The magnet may have a U-shape cross-sectional shape.

The plurality of magnets may be spaced apart from each other along a first direction and contact each other along a second direction which crosses the first direction.

Polarities of second surface sides of the plurality of magnets may alternate along the first direction and may be the same along the second direction.

The yoke plate may include a plurality of grooves extending along the second direction, and two or more magnets may be in each groove of the yoke plate.

The first surface of the magnet may be a flat or curved surface.

A deposition apparatus includes a deposition source providing a deposition material a mask assembly over the deposition source, and a magnet assembly over the mask assembly and including a yoke plate and a plurality of magnets which are fixed to the yoke plate. Each magnet includes a first surface facing the yoke plate, a second surface facing the mask assembly, and a groove in the second surface.

The groove may extend along a length of the magnet at a depth at a central portion of the second surface.

The groove may not penetrate the magnet along a thickness direction of the magnet.

The groove may have a quadrangular, triangular, semicircular, or semi-elliptical cross-sectional shape.

The plurality of magnets may protrude from the yoke plate toward the mask assembly.

The plurality of magnets may be spaced apart from each other along a first direction and contact each other along a second direction crossing the first direction.

Polarities of second surface sides of the plurality of magnets may alternate in the first direction, and may be the same in the second direction.

The yoke plate may include a plurality of grooves extending along the second direction, and two or more magnets may be in each groove of the yoke plate.

The mask assembly may include a plurality of mask sticks arranged in the second direction, and each mask stick may extend along the first direction.

The deposition apparatus may further include a cool plate between the mask assembly and the magnet assembly.

According to one or more of the embodiments, it is possible to reduce peak adhesive force while maintaining an average adhesive force applied to a mask assembly by magnets of the magnet assembly. Accordingly, defects in a display panel may be reduced or effectively prevented.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
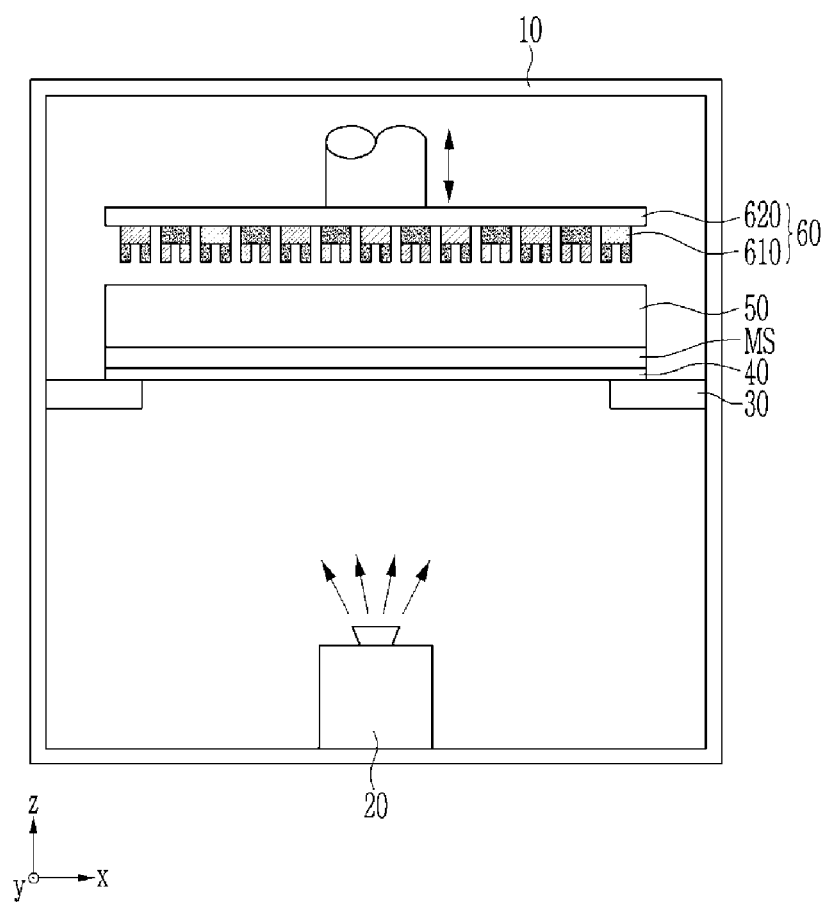
FIG. 1 schematically illustrates an embodiment of a deposition apparatus.

Embodiments of the invention will be described more fully hereinafter with reference to the accompanying drawings, in which embodiments are shown. Like reference numerals refer to like elements throughout.

A size and thickness of each element illustrated in the drawings are arbitrarily shown for ease of description.

It will be understood that when an element such as a layer, film, area, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In the specification, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the specification, "connected" does not mean only when two or more elements are directly connected, but when two or more elements are indirectly connected through other elements, and when they are physically connected or electrically connected, and further, it may be referred to as elements different names depending on a position or function, and may also be referred to as a case in which respective parts that are substantially integrated are linked to each other.

In the drawings, as symbols x, y, and z used for indicating directions, 'x' is a first direction, 'y' is a second direction crossing the first direction, and z is a third direction crossing each of the first direction and the second direction. The first direction x, the second direction y, and the third direction z may correspond to a horizontal direction, a vertical direction, and a thickness direction of the display device, respectively. Crossing directions may be perpendicular to each other, without being limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 schematically illustrates an embodiment of a deposition apparatus.

Referring to FIG. 1, a deposition apparatus may include a chamber 10 (e.g., deposition chamber), a deposition source 20 (e.g., deposition material source), a holder 30 (e.g., deposition target holder), a mask assembly 40 (e.g., deposition mask assembly), a cool plate 50 (e.g., a cooling plate), and a magnet assembly 60. The chamber 10 may be a vacuum chamber, and the deposition source 20, the holder 30, the mask assembly 40, the cool plate 50, and the magnet assembly 60 may each be disposed within the chamber 10. Deposition of a deposition material on a deposition target such as a mother substrate MS (or a target substrate) for providing or manufacturing deposition patterns of a display panel and the like may be performed in the chamber 10 of the deposition apparatus. The mother substrate MS which is in the chamber 10 may be disposed between the mask assembly 40 and the cool plate 50.

The deposition source 20 may store a deposition material (for example, a material for providing or forming an emission layer EL as a deposition pattern of a light emitting display device), and may evaporate the deposition material in a direction toward the mother substrate MS as a deposition target.

The mask assembly 40 may be detachably fixed to the holder 30 in a position over the deposition source 20. The mother substrate MS may be disposed on the mask assembly 40 to be aligned with the mask assembly 40. As the mask assembly 40 is disposed between the deposition source 20 and the mother substrate MS within the chamber 10, a deposition material may be selectively deposited on the mother substrate MS.

In order to closely contact the mask assembly 40 and the mother substrate MS to each other, the magnet assembly 60 may be disposed over the mother substrate MS within the chamber 10. The magnet assembly 60 may include a magnet 610 provided in plural including a plurality of magnets 610 and a yoke plate 620 (e.g., support plate) which supports the magnets 610. The yoke plate 620 may include a lower surface closest to the mask assembly 40 and an upper surface which is opposite to the lower surface and furthest from the mask assembly 40. The magnets 610 may be positioned on a surface facing the mask assembly 40 among the opposing surfaces of the yoke plate 620. Within the chamber 10, the magnets 610 may be positioned on the lower surface which faces the mask assembly 40. The magnets 610 may protrude downward from the yoke plate 620 in a direction toward the mask assembly 40.

The mask assembly 40 is pulled toward the magnet assembly 60 by magnetic force of the magnets 610 of the magnet assembly 60. The mask assembly 40 (more specifically, mask sticks 430 as deposition masks of the mask assembly 40 to be described later) may be attached to and closely contact the mother substrate MS which is between the mask assembly 40 and the magnet assembly 60. Accordingly, improvement of a lifting phenomenon between the mask assembly 40 and the mother substrate MS, and improvement of a shadow effect during the deposition process may be possible. The magnet assembly 60 may be provided to be moveable along a third direction z within the chamber 10, and the deposition apparatus may include an actuator (not shown) for moving the magnet assembly 60 within the chamber 10.

The cool plate 50 may be positioned between the mother substrate MS and the magnet assembly 60 to pressurize the mother substrate MS under the weight of the cool plate 50, and improve a degree of close contact between the mother substrate MS and the mask assembly 40. The cool plate 50 may be non-magnetic so as to not be affected by magnetism of the magnets 610 of the magnet assembly 60.

Figure 2:
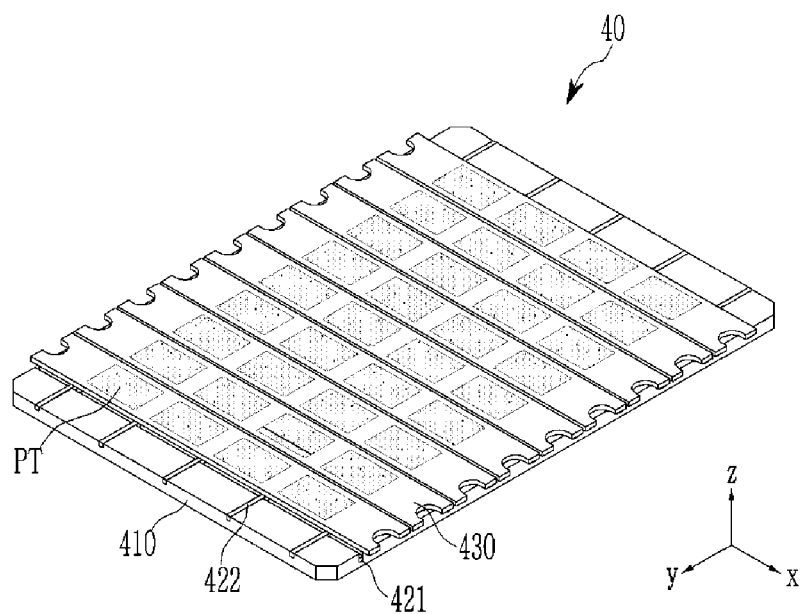
FIG. 2 illustrates a perspective view of an embodiment of a mask assembly.

FIG. 2 illustrates a perspective view of an embodiment of the mask assembly 40.

Referring to FIG. 2, the mask assembly 40 may include a frame 410 (e.g., mask frame), supporting sticks 421 and 422, and a mask stick 430 provided in plural including a plurality of mask sticks 430 (e.g., a deposition mask provided in plural in including a plurality of deposition masks).

The frame 410 may include four sides or four portions that together define an opening (e.g., frame opening) with a substantially quadrangular shape, and may be substantially provided in the shape of a quadrangle. The frame 410 may include or be made of a material having strong rigidity and low deformation so as to fix positions of the mask sticks 430 within the mask assembly 40. In an embodiment, for example, the frame 410 may include or be made of an alloy such as a nickel-iron alloy (Inver) or stainless steel.

The supporting sticks 421 and 422 may include a first supporting stick 421 provided in plural including a plurality of first supporting sticks 421 positioned across the frame 410 along a first direction x and a second supporting stick 422 provided in plural including a plurality of second supporting sticks 422 positioned across the frame 410 along a second direction y interesting the first direction x. The frame 410 may include grooves (e.g., supporting stick grooves) in which various supporting sticks may be provided. The supporting sticks 421 and 422 may be inserted into the grooves provided or formed in the frame 410, and may be fixed to the frame 410 such as by welding or the like. The supporting sticks 421 and 422 may include or be made of an alloy such as a metal, for example, stainless steel.

The first supporting sticks 421 may have a length direction (extension direction) parallel to the first direction x. A thickness direction of the deposition apparatus and various components or elements thereof may be defined along the third direction z. The first supporting sticks 421 may be fixed to be positioned under the second supporting sticks 422, that is, closer to the frame 410 than the second supporting sticks 422. The first supporting sticks 421 may be positioned between the frame 410 and the second supporting sticks 422. The first supporting sticks 421 may support the second supporting sticks 422, and may indirectly support the mask sticks 430. The first supporting sticks 421 may suppress deformation of the frame 410.

Mask sticks 430 may be adjacent to each other along the second direction y. Adjacent mask sticks 430 may define a gap therebetween. The first supporting sticks 421 may correspond to the gap between adjacent mask sticks 430. The first supporting stick 421 may block a gap between adjacent mask sticks 430, and may be referred to as a gap stick. The first supporting stick 421 may reduce or effectively prevent a deposition material from being deposited onto a deposition targets such as a substrate SB of a display panel, through the gap between the mask sticks 430 of the mask assembly 40.

The second supporting sticks 422 may have a length direction (extension direction) parallel to the second direction y. An upper surface of the second supporting stick 422 and an upper surface of the frame 410 may be closest to the mask sticks 430. The upper surface of the second supporting stick 422 and the upper surface of the frame 410 may be on substantially the same plane (e.g., may be coplanar with each other). The second supporting sticks 422 which are closer to the mask sticks 430 than the first supporting sticks 421, may support the mask sticks 430. The second supporting sticks 422 may suppress deformation of the frame 410. The second supporting sticks 422 may partition patterns PT (e.g., deposition patterns) of the mask sticks 430 into a pattern of unit cells. Each unit cell may correspond to one display panel.

The mask sticks 430 may be positioned across the frame 410 along the first direction x, and may be fixed to the frame 410. The mask stick 430 may be fixed to the frame 410 such as through welding. In an embodiment, the mask stick 430 which is tensioned in a length direction thereof may be fixed to the frame 410 such as by welding. A tension welding machine may be used for tensioning of the mask stick 430 and welding of the mask stick 430 to the frame 410. Each of the mask sticks 430 may include opposing ends at which the mask sticks 430 are respectively attached to the frame 410. Both of the opposing ends of the mask stick 430 may have a structure suitable for clamping for tensioning. The mask sticks 430 may be arranged along the second direction y, and each mask stick 430 may extend along the first direction x (e.g., length direction).

The mask sticks 430 may be combined together to form a deposition mask corresponding to one of the mother substrate MS. Therefore, an individual one of the mask stick 430 may be referred to as a split mask. Each mask stick 430 may include a pattern PT provided in plural along the length direction of the mask stick 430 to include a plurality of patterns PT respectively corresponding to a plurality of cells. In an embodiment, for example, each pattern may include openings (e.g., deposition openings) corresponding to a pattern of emission layers (for example, red emission layers, green emission layers, or blue emission layers) of a specific color to be provided or formed in each cell of the mother substrate MS.

The mask stick 430 may include or be made of a metal or alloy, for example, an alloy such as a nickel-iron alloy (Invar) or stainless steel. The mask stick 430 may be referred to as a fine metal mask ("FMM") or fine deposition mask.

The mask sticks 430 may be positioned on the second supporting sticks 422. A lower surface of the mask stick 430 may be closest to the first and second supporting sticks 421 and 422 along the thickness direction. Lower surfaces of the mask sticks 430 may contact upper surfaces of the second supporting sticks 422. The mask sticks 430 may be supported by the second supporting sticks 422 to suppress sagging or deformation of the mask sticks 430 which are attached to the frame 410.

In providing the mask assembly 40, after first fixing of the second supporting sticks 422 to the frame 410, the first supporting sticks 421 may be fixed. After second fixing of the first supporting sticks 421 to the frame 410, the mask sticks 430 may be fixed to the frame 410. The first supporting sticks 421 and the second supporting sticks 422 may also be welded to the frame 410 in a tensioned state along a length direction thereof of the respective supporting sticks.

Figure 3:
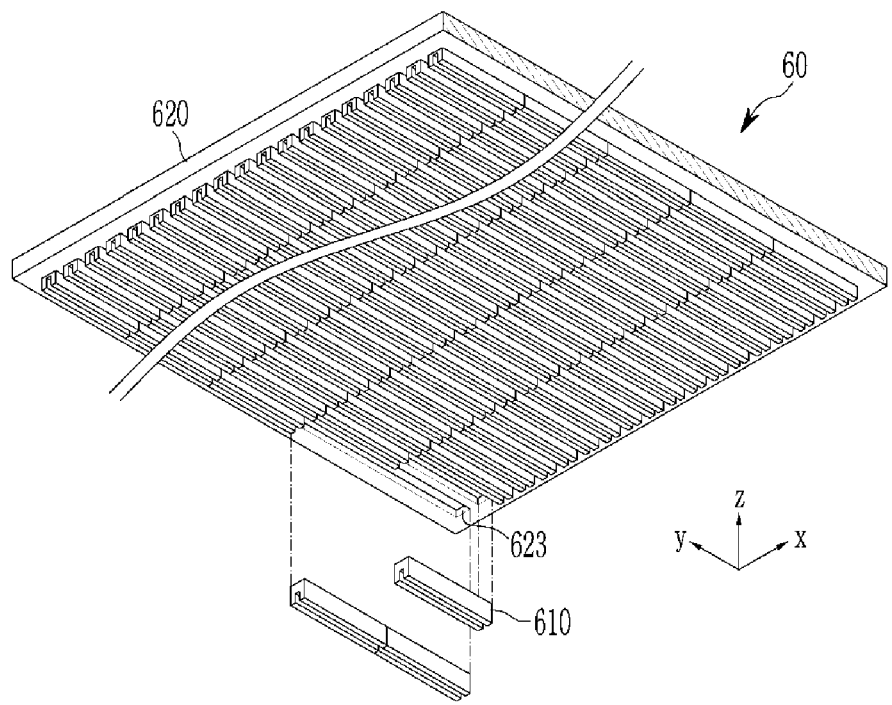
FIG. 3 illustrates a perspective view of an embodiment of a magnet assembly.
Figure 4:
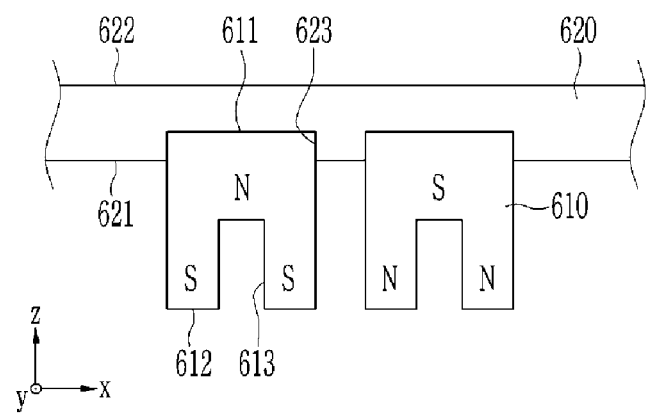
FIG. 4 illustrates a cross-sectional view of an embodiment of a magnet assembly.
Figure 5:
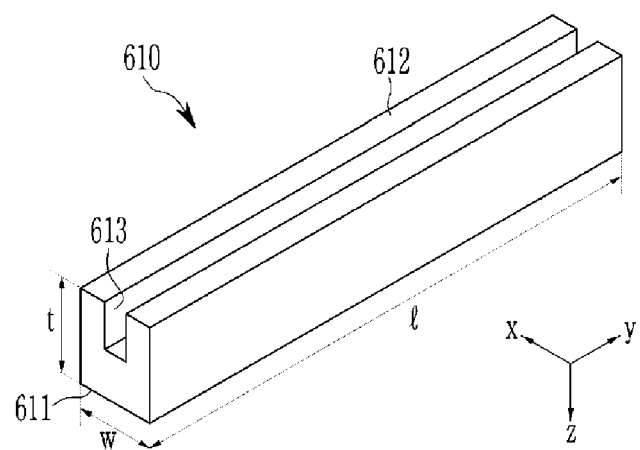
FIG. 5 illustrates a perspective view of an embodiment of a magnet.

FIG. 3 illustrates a perspective view of an embodiment of the magnet assembly 60, FIG. 4 illustrates a cross-sectional view of an embodiment of the magnet assembly 60, and FIG. 5 illustrates a perspective view of an embodiment of the magnet 610.

Referring to FIG. 3, FIG. 4, and FIG. 5, the magnet assembly 60 may include the magnets 610 and the yoke plate 620. The magnets 610 may be fixed at positions along the yoke plate 620. The magnets 610 may be disposed at intervals along the first direction x. The magnets 610 may be spaced apart from each other along the first direction x. The magnets 610 may be provided or disposed to contact each other along the second direction y. Unlike shown, the magnets 610 may be disposed to be spaced apart from each other along the second direction y.

For stable fixing of the magnets 610 within the magnet assembly 60, a groove 623 (e.g., plate groove or first groove) may be provided in plural including a plurality of grooves 623 provided or formed in the yoke plate 620. A portion of the magnets 610 may be positioned within the grooves 623. The grooves 623 may be provided or formed to conform to shapes of portions of the magnets 610 which are positioned within the grooves 623. In an embodiment, for example, the grooves 623 may be provided or formed so that the magnets 610 may be fitted into the grooves 623. That is, a shape of the grooves 623 may correspond to portions of the magnets 610 which are inside the grooves 623. The magnets 610 may extend out of the grooves 623 to define a portion of the magnets 610 which is outside of the yoke plate 620.

The yoke plate 620 may include a first surface 621 facing the magnets 610 (e.g., closest to the magnets 610 along the thickness direction) and a second surface 622 which is opposite to the first surface 621 and facing the first surface 621. The grooves 623 of the yoke plate 620 may be provided or formed concave from the first surface 621 in a direction away from the magnets 610. The grooves 623 may be provided or formed at intervals along the first direction x, and a major dimension (e.g., groove length) of each of the grooves 623 may be provided or formed along the second direction y. In the deposition apparatus, the magnet assembly 60 may be disposed such that an extension direction of the groove 623 of the yoke plate 620 and an extension direction of the mask stick 430 may cross each other, such as being orthogonal to each other, without being limited thereto.

The yoke plate 620 may include or be made of a magnetic material such as stainless steel. Accordingly, the magnets 610 may be attached to and fixed to the yoke plate 620 without a separate fixing member. The magnets 610 may be attachable to and detachable from the yoke plate 620 (e.g., removably fixed). Optionally or additionally, the magnets 610 may be fixed by a fixing member such as a bolt, an adhesive, or the like.

The magnets 610 may include first surfaces 611 facing the yoke plate 620 and second surfaces 612 which are opposite to the first surfaces 611 and facing the first surfaces 611. In the chamber 10 of the deposition apparatus, the second surfaces 612 of the magnets 610 may face the mask assembly 40 (e.g., may be closest to the mask assembly 40). A second surface 612 of a magnet 610 may define a distal end of the magnet 610. By magnetic force from the second surface 612 of the magnets 610 which biases the mask sticks 430 toward the magnet assembly 60, the mask sticks 430 of the mask assembly 40 may be attached to the mother substrate MS with an adhesive force.

The adhesive force between the mask sticks 430 and the mother substrate MS may vary depending on positions along the mask sticks 430. Since the magnets 610 are spaced apart from each other at intervals along the first direction x, the adhesive force of the mask sticks 430 dependent on the magnetic force of the magnets 610 may be changed along the first direction x. The adhesive force may be expressed as peak adhesive force and average adhesive force. The peak adhesive force may be an adhesive force at points or areas at which the adhesive force is largest along an entire area of the mask stick 430, and the average adhesive force may be an average of the adhesive forces along the entire area of the mask stick 430. The mask stick 430 may have the peak adhesive force at a period corresponding to a pitch of the magnets 610 along the first direction x. Arrangement of the magnets 610 may be set in consideration of the peak adhesive force and average adhesive force of the mask sticks 430.

Within the magnet 610, a side corresponding to the first surface 611 and a side corresponding to the second surface 612 may have different polarities from each other. In an embodiment, for example, the side corresponding to the first surface 611 may be the N pole of the magnet 610 (N in FIG. 4), and the side corresponding to the second surface 612 (e.g., the distal end) may be the S pole (S in FIG. 4). In contrast, the side at the first surface 611 may be the S pole, and the side at the second surface 612 may be the N pole. In order for the magnet assembly 60 to provide a more uniform magnetic force, the magnets 610 may be disposed so that the polarities at the second surfaces 612 thereof (e.g., distal end polarities) alternate along the first direction x. The magnets 610 may be disposed so that the polarities at the second surfaces 612 thereof are the same along the second direction y. In an embodiment, for example, the each magnet 610 includes two portions of the second surface 612 spaced apart from each other by the magnet groove (e.g., groove 613), and both of the two portions of the second surface 612 having a first polarity or a second polarity which is different from the first polarity to define a plurality of polarities among the plurality of magnets 610. The polarities of the plurality of magnets 610 may alternate along the first direction x and may be the same along the second direction y.

Two or more of the magnets 610 may be disposed in one of the grooves 623 of the yoke plate 620, along the second direction y. The polarities at the first surfaces 611 of the magnets 610 which are in a same one groove 623 among the plurality of grooves 623 may be the same as each other. The magnets 610 disposed in a same one groove 623 may be disposed so that edges or ends thereof are in contact with each other. Unlike as shown in FIG. 3, one magnet 610 may be disposed in one groove 623.

Referring to FIG. 5, the magnet 610 may have a substantially rectangular parallelepiped shape having a length l, a width w and a thickness t, and may include a groove 613 (e.g., magnet groove or second groove) provided or formed to be concave from the second surface 612 thereof. A major dimension of the groove 613 (e.g., groove length) may be formed along the length l of the magnet 610. Accordingly, the magnetic peak region may be moved from a single location at the second surface 612 of the magnet 610 to multiple locations at two portions of the second surface 612 at opposing sides of the magnet along the first direction x. A magnetic peak region may correspond to or be defined at the two portions of second surface 612 which are spaced apart from each other by the magnet groove along the first direction x. That is, each one magnet 610 may define or provide two magnetic peak regions.

The groove 613 may extend along the second direction y and along the length l of the magnet 610 at a depth along the third direction z, in a central portion of the second surface 612. The central portion may be defined along the first direction x. The groove 613 may penetrate the magnet 610 along the second direction y. That is, the groove 613 may be open at both of opposing ends of the magnet 610 along the second direction y. The groove 613 may not penetrate the magnet 610 in the third direction z. That is, the each magnet 610 may include a thickness in a direction from the first surface 611 to the second surface 612, and the magnet groove spaced apart from the first surface 611 and open at the second surface 612 which faces the deposition mask. A bottom of the groove 613 (e.g., magnet groove) may be spaced apart from the first surface 611 of the magnet 610 along the thickness direction.

A depth of the groove 613 along the third direction z may be about ⅓ to about ⅔ of the thickness t as a maximum thickness of the magnet 610, for example, about ½ thereof. In a view along the second direction y, a cross-sectional shape of the magnet 610 having the groove 613 may be substantially a quadrangle, and a cross-sectional shape of the magnet 610 may be a substantially U-shape. The magnet 610 may be symmetrical with respect to the groove 613. The length l of the magnet 610 may be larger than the width w, and may be larger than the thickness t. In an embodiment, for example, the length l may be about 10 millimeters (mm) or more, and the width w and the thickness t may be less than about 10 mm, respectively. The length l of the magnet 610 may be larger than a sum of the width w and the thickness t.

Figure 6:
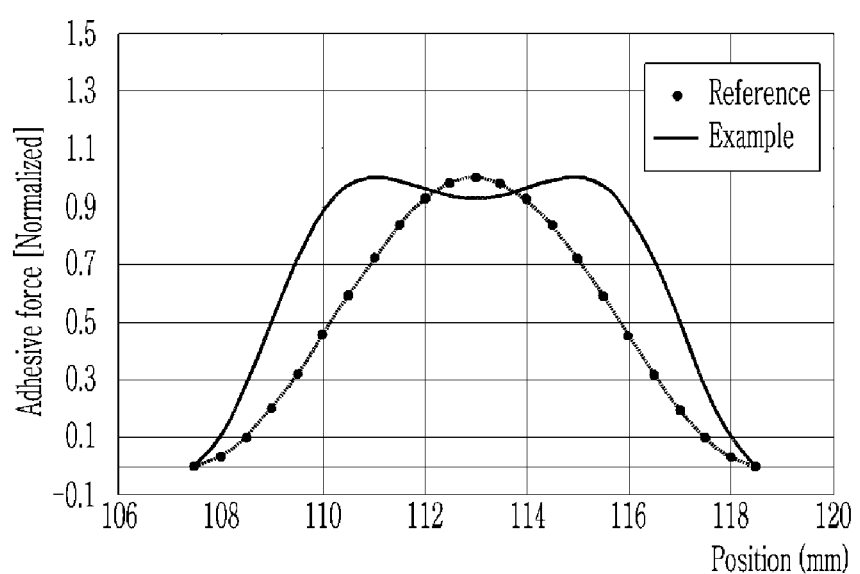
FIG. 6 illustrates graphs of adhesive force of mask sticks in deposition apparatuses according to a comparative example and an embodiment.

FIG. 6 illustrates graphs of adhesive force of mask sticks 430 in deposition apparatuses according to a comparative example ("Reference") and an embodiment of the invention (e.g., 'Example'). The adhesive force may be defined by or correspond to the magnetic force applied to a mask stick 430 by a magnet 610 of the magnet assembly 60. The adhesive force may correspond to locations along the magnet 610.

The comparative example includes the magnet assembly 60 in which no groove 613 is provided or formed extended from the second surface 612 of the magnet 610, and the example includes the magnet assembly 60 in which the grooves 613 are provided or formed the second surface 612 of the magnet 610. The magnet 610 of the comparative example has a quadrangular cross-sectional shape, and the magnet 610 of the example has a U-shaped cross-sectional shape. Both graphs show the adhesive force of the mask stick 430 in an area corresponding to one magnet 610 with the width w of 5 mm and the thickness t of 4 mm.

The graph of the comparative example shows a Gaussian distribution in which the adhesive force is largest at the central portion of the magnet 610 and the adhesive force gradually decreases in a direction away from the central portion. Since the magnets 610 are arranged along the first direction x with respect to the magnet assembly 60, the adhesive force may be periodically increased or decreased along the first direction x like a sinusoidal curved line. In order to allow the magnet assembly 60 to have a reference average adhesive force, the peak adhesive force corresponding to the central portion of the magnet 610 needs to have a reference value. However, depending on characteristics of the deposition material and the mother substrate MS, the adhesive force between the mask stick 430 and the mother substrate MS may be excessive, and thus defects may occur. In an embodiment, for example, in the display panel provided or manufactured by the deposition apparatus including the magnet 610 of the comparative example ('Reference'), image quality defects such as stripes may occur in a screen area of the display panel corresponding to the area of the mask stick 430 having the peak adhesive force.

The graph of the Example in FIG. 6 shows that the adhesive force is largest at both of opposing sides of the magnet 610 instead of at the central portion of the magnet 610, and the adhesive force gradually decreases in opposing directions away from a respective opposing side. A peak adhesive force may correspond to each of the two portions of the second surface 612. Since the groove 613 is provided or formed at the central portion of the second surface 612 of the magnet 610 (e.g., the second surface 612 is omitted at the groove 613), the adhesive force at the central portion may decrease and the adhesive force may be distributed to both of opposing sides of the central portion. In addition, when the peak adhesive force is set to be the same as that of the comparative example, an adhesive distribution in which the average adhesive force is increased is obtained. When the adhesive force is distributed as in the Example, the average adhesive force may be maintained while reducing the peak adhesive force through a distance adjustment between the magnet 610 and the mask stick 430. Since the peak adhesive force applied to a narrow region as in the comparative example is distributed in a wide region, reducing or effectively preventing an excessive adhesive force from being applied to a specific region is possible. In addition, since the average adhesive force may be maintained, the mask sticks 430 may closely contact the mother substrate MS at a desired degree of adhesive force.

Figure 7:
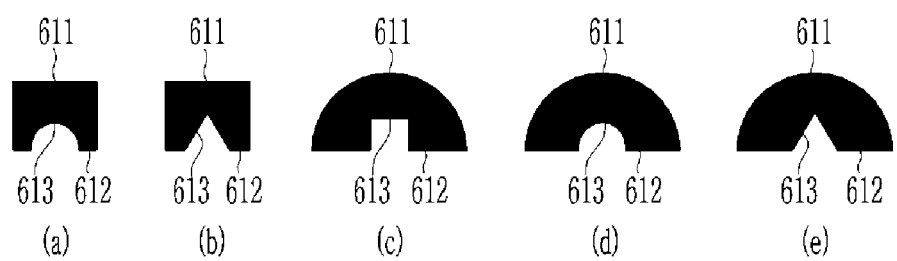
FIG. 7 illustrates cross-sectional views (a) through (e) of embodiments of magnets of magnet assemblies.

FIG. 7 illustrates cross-sectional views (a) through (e) of embodiments of magnets 610 of magnet assemblies 60.

The groove 613 of the magnet 610 may have various cross-sectional shapes in addition to the quadrangular cross-sectional shape described above. In an embodiment, for example, the cross-sectional shape of the groove 613 may be a semicircular or semi-elliptical shape as shown in views (a) and (d) of FIG. 7, or a triangular shape as shown in views (b) and (e) of FIG. 7. The first surface 611 of the magnet 610 may be a flat surface as shown in views (a) and (b) of FIG. 7, or may be a curved surface as shown in views (c), (d) and (e) of FIG. 7. Even if the first surface 611 of the magnet 610 is a curved surface, the magnet 610 may be stably fixed by providing or forming the groove 623 of the yoke plate 620 into a curved surface corresponding to the curved surface of the first surface 611. In either case, within the magnet assembly 60, the first surface 611 of the magnet 610 faces the yoke plate 620, and the groove 613 of the magnet 610 may be recessed to be concave from the second surface 612 opposing to the first surface 611.

Figure 8:
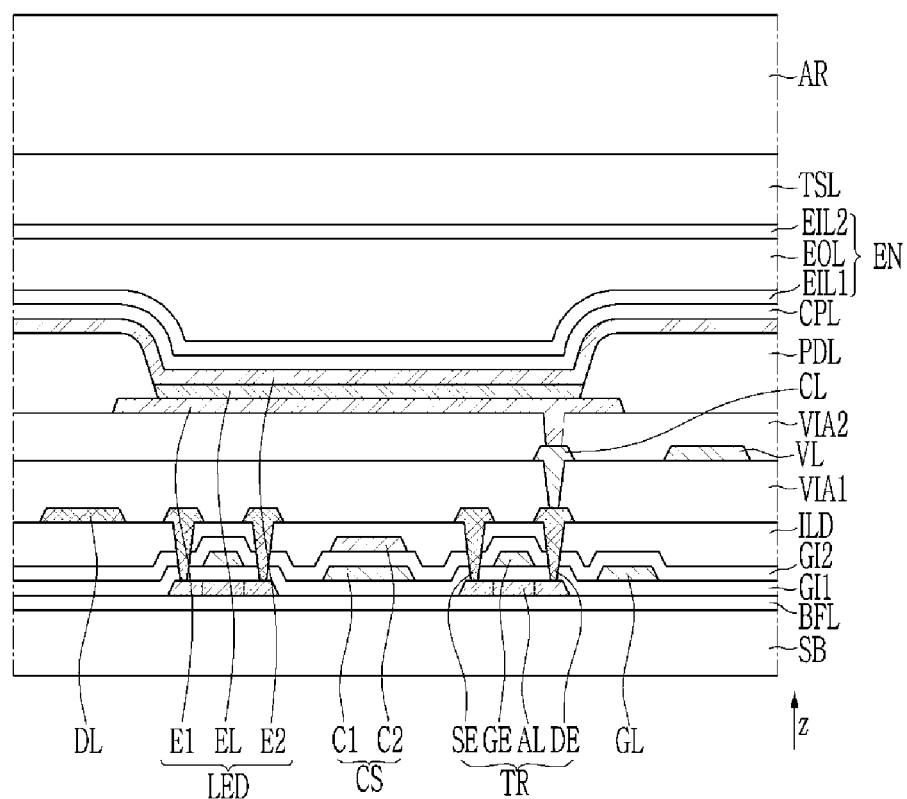
FIG. 8 illustrates a schematic cross-sectional view of an embodiment of a stacked structure of a display panel.

FIG. 8 illustrates a schematic cross-sectional view of an embodiment of a stacked structure of a display panel. In the deposition apparatus as shown in FIG. 1, cells provided or formed in the mother substrate MS through a deposition process may be divided to be used as a display panel of a display device. That is, cells in the mother substrate MS may correspond to a display panel, without being limited thereto. The cross-section shown in FIG. 8 may substantially correspond to one pixel area of the display panel which includes various patterns provided as a deposition pattern by a deposition apparatus in a deposition method.

The display panel may include a substrate SB, a transistor TR provided or formed on the substrate SB, and a light emitting element such as a light emitting diode LED which is connected to the transistor TR. The light emitting diode LED may correspond to a pixel of the display panel.

The substrate SB may include or be made of a material such as glass. The substrate SB may be a flexible substrate including a polymer resin such as polyimide, polyamide, or polyethylene terephthalate.

A buffer layer BFL may be disposed on the substrate SB. The buffer layer BFL may block impurities from the substrate SB when a semiconductor layer AL is provided or formed, thereby improving characteristics of the semiconductor layer AL, and flattening a surface of the substrate SB to reduce stress of the semiconductor layer AL. The buffer layer BFL may include an inorganic insulating material such as a silicon nitride ($SiN_x$), a silicon oxide ($SiO_x$), or a silicon oxynitride ($SiO_xN_y$), and may be a single layer or a multilayer. The buffer layer BFL may include amorphous silicon (a-Si).

A semiconductor layer AL of the transistor TR may be disposed on the buffer layer BFL. The semiconductor layer AL may include a first region, a second region, and a channel region between the first and second regions. The semiconductor layer AL may include one of amorphous silicon, polysilicon, and an oxide semiconductor. In an embodiment, for example, the semiconductor layer AL may include a low temperature polycrystalline silicon ("LTPS"), or an oxide semiconductor material including at least one of zinc (Zn), indium (In), gallium (Ga), and tin (Sn). In an embodiment, for example, the semiconductor layer AL may include an indium-gallium-zinc oxide ("IGZO").

A first gate insulating layer GI1 may be disposed on the semiconductor layer AL. The first gate insulating layer GI1 may include an inorganic insulating material such as a silicon nitride, a silicon oxide, or a silicon oxynitride, and may be a single layer or a multilayer.

A first gate conductive layer that may include a gate electrode GE of the transistor TR, a gate line GL and a first electrode C1 of a capacitor CS may be disposed on the first gate insulating layer GI1. The first gate conductive layer may include molybdenum (Mo), aluminum (Al), copper (Cu), titanium (Ti), and the like, and may be a single layer or a multilayer.

A second gate insulating layer GI2 may be disposed on the first gate conductive layer. The second gate insulating layer GI2 may include an inorganic insulating material such as a silicon nitride, a silicon oxide, or a silicon oxynitride, and may be a single layer or a multilayer.

A second gate conductive layer that may include a second electrode C2 of the capacitor CS may be disposed on the second gate insulating layer GI2. The second gate conductive layer may include molybdenum (Mo), aluminum (Al), copper (Cu), titanium (Ti), and the like, and may be a single layer or a multilayer.

An interlayer insulating layer ILD may be disposed on the second gate insulating layer GI2 and the second gate conductive layer. The interlayer insulating layer ILD may include an inorganic insulating material such as a silicon nitride, a silicon oxide, or a silicon oxynitride, and may be a single layer or a multilayer.

A first data conductive layer may include a first electrode SE and a second electrode DE of the transistor TR, and a data line DL may be disposed on the interlayer insulating layer ILD. The first electrode SE and the second electrode DE may be respectively connected to the first region and the second region of the semiconductor layer AL through contact holes provided or formed in the insulating layers GI1, GI2, and ILD. One of the first electrode SE and the second electrode DE may be a source electrode, and the other thereof may be a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu), and may be a single layer or a multilayer.

A first planarization layer VIA1 may be disposed on the first data conductive layer. The first planarization layer VIA1 may be an organic insulating layer. In an embodiment, for example, the first planarization layer VIA1 may include an organic insulating material such as a general purpose polymer such as poly(methyl methacrylate) and polystyrene, a polymer derivative having a phenol-based group, an acryl-based polymer, an imide-based polymer, a polyimide, or a siloxane-based polymer.

A second data conductive layer that may include a voltage line VL, a connection line CL, and the like may be disposed on the first planarization layer VIM. The voltage line VL may transmit a voltage such as a driving voltage, a common voltage, an initialization voltage, or a reference voltage to the pixel area. The connection line CL may be connected to the second electrode DE of the transistor TR through a contact hole provided or formed in the first planarization layer VIM. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu), and may be a single layer or a multilayer.

A second planarization layer VIA2 may be disposed on the second data conductive layer. The second planarization layer VIA2 may be an organic insulating layer. In an embodiment, for example, the second planarization layer VIA2 may include an organic insulating material such as a general purpose polymer such as poly(methyl methacrylate) and polystyrene, a polymer derivative having a phenol-based group, an acryl-based polymer, an imide-based polymer, a polyimide, or a siloxane-based polymer.

A first electrode E1 of the light emitting diode LED may be disposed on the second planarization layer VIA2. The first electrode E1 may be referred to as a pixel electrode. The first electrode E1 may be connected to the connection line CL through a contact hole provided or formed in the second planarization layer VIA2. Therefore, the first electrode E1 may be electrically connected to the second electrode DE of the transistor TR to receive an electrical driving current that controls luminance of the light emitting diode. The transistor TR to which the first electrode E1 is connected may be a driving transistor, or a transistor electrically connected to the driving transistor. The first electrode E1 may include or be made of a reflective conductive material or a translucent conductive material, or it may be made of a transparent conductive material. The first electrode E1 may include a transparent conductive material such as an indium tin oxide ("ITO") or an indium zinc oxide ("IZO"). The first electrode E1 may include a metal such as lithium (Li), calcium (Ca), aluminum (Al), silver (Ag), magnesium (Mg), or gold (Au), or a metal alloy thereof.

A pixel defining layer PDL that may be an organic insulating layer may be disposed on the second planarization layer VIA2. The pixel defining layer PDL may be referred to as a partition wall, and may define or have an opening (e.g., pixel opening) overlapping the first electrode E1.

An emission layer EL of the light emitting diode LED may be disposed on the first electrode E1. At least one of a hole injection layer, a hole transporting layer, an electron transporting layer, and an electron injection layer may be disposed on the first electrode E1 in addition to the emission layer EL. In an embodiment, the mask assembly 40, the cool plate 50 and the magnet assembly 60 that are described above may be used to deposit the emission layer EL as a deposition pattern.

A second electrode E2 of the light emitting diode LED may be disposed on the emission layer EL. The second electrode E2 may be referred to as a common electrode. The second electrode E2 may have a light transmittance by providing or forming a thin layer of a metal or a metal alloy having a low work function such as calcium (Ca), barium (Ba), magnesium (Mg), aluminum (Al), silver (Ag), or the like. The second electrode E2 may include a transparent conductive oxide such as an indium tin oxide ("ITO") or an indium zinc oxide ("IZO").

The first electrode E1, the emission layer EL, and the second electrode E2 of each pixel form a light emitting diode LED such as an organic light emitting diode or an inorganic light emitting diode. The first electrode E1 may be an anode of the light emitting diode, and the second electrode E2 may be a cathode of the light emitting diode.

A capping layer CPL may be disposed on the second electrode E2. The capping layer CPL may improve light efficiency through refractive index adjustment. The capping layer CPL may be disposed to entirely cover the second electrode E2. The capping layer CPL may include an organic insulating material or an inorganic insulating material.

An encapsulation layer EN may be disposed on the capping layer CPL. The encapsulation layer EN may encapsulate the light emitting diode LED to reduce or effectively prevent moisture or oxygen from penetrating from outside the encapsulation layer EN. The encapsulation layer EN may be a thin film encapsulation layer including one or more inorganic layers EIL1 and EIL2, and one or more organic layer EOL.

A touch sensor layer TSL including touch electrodes may be disposed on the encapsulation layer EN. The touch electrodes may have a mesh shape having an opening overlapping the light emitting diode LED. A functional layer such as an anti-reflective layer AR for reducing reflection of external light may be disposed on the touch sensor layer TSL.

A cover window (not shown) for protecting an entirety of the surface of the display panel may be disposed on the anti-reflective layer AR.

A protective film (not shown) for protecting the display panel may be disposed under the substrate SB. A functional sheet (not shown) including at least one of a cushion layer, a heat dissipation sheet, a light blocking sheet, a waterproof tape, and an electromagnetic blocking film may be disposed under the protective film.

While the invention have been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. A magnet assembly comprising:
a support plate; and
a plurality of magnets which are fixed to the support plate and apply a magnetic force to a deposition mask,
wherein each magnet among the plurality of magnets defines:
a first surface facing the support plate,
a second surface opposite to the first surface and facing the deposition mask, the second surface comprising a first sub-surface, and a second sub-surface which is closer to the first surface than the first sub-surface, and
a magnet groove defined with the second sub-surface.
2. The magnet assembly of claim 1, wherein the each magnet further includes:
a major dimension defining a length, and
the magnet groove extending along the length and having a depth from the second surface.
3. The magnet assembly of claim 1, wherein the each magnet further includes:
a major dimension defining a length, and
the magnet groove extending along the length at a central portion of the second surface.
4. The magnet assembly of claim 1, wherein
the magnet groove which is defined with the second sub-surface being open at the second surface which faces the deposition mask.
5. The magnet assembly of claim 1, wherein the magnet groove has a quadrangular, triangular, semicircular or semi-elliptical cross-sectional shape defined with the second sub-surface.
6. The magnet assembly of claim 1, wherein the magnet has a U-shape cross-sectional shape.
7. The magnet assembly of claim 1, wherein the plurality of magnets are spaced apart from each other along a first direction and contact each other along a second direction which crosses the first direction.
8. The magnet assembly of claim 7, wherein
the plurality of magnets includes a plurality of polarities including a first polarity and a second polarity which is different from the first polarity,
the each magnet among the plurality of magnets further defines:
two portions of the first sub surface spaced apart from each other by the magnet groove, and both of the two portions of the first sub surface having a same polarity among the first polarity and the second polarity, and the plurality of polarities of the plurality of magnets alternate along the first direction and are the same along the second direction.

9. The magnet assembly of claim 7, wherein the support plate includes a plurality of plate grooves each extending along the second direction, and two or more magnets of the plurality of magnets are in each plate groove among the plurality of plate grooves.

10. The magnet assembly of claim 1, wherein the first surface of the magnet is a flat or curved surface.

* * * * *